United States Patent
Werhane et al.

(10) Patent No.: US 11,081,166 B1
(45) Date of Patent: Aug. 3, 2021

(54) MEMORY DEVICE RANDOM OPTION INVERSION

(71) Applicant: Micron Technology, Inc., Boise, ID (US)

(72) Inventors: Kevin G. Werhane, Kuna, ID (US); Jason M. Johnson, Nampa, ID (US); Yoshinori Fujiwara, Boise, ID (US); Tyrel Z. Jensen, Meridian, ID (US); Daniel S. Miller, Boise, ID (US); David E. Jefferson, Meridian, ID (US); Vivek Kotti, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/000,202

(22) Filed: Aug. 21, 2020

(51) Int. Cl.
*G11C 11/408* (2006.01)
*G11C 11/22* (2006.01)

(52) U.S. Cl.
CPC ........ *G11C 11/4087* (2013.01); *G11C 11/221* (2013.01); *G11C 11/2253* (2013.01)

(58) Field of Classification Search
CPC .............. G11C 11/4087; G11C 11/221; G11C 11/2253

USPC .......................................... 365/149, 158, 200
See application file for complete search history.

(56) References Cited

U.S. PATENT DOCUMENTS

| | | | |
|---|---|---|---|
| 2005/0127945 A1* | 6/2005 | Park ................. | H03K 19/00346 326/52 |
| 2007/0217276 A1* | 9/2007 | Sugisawa ............ | G11C 7/1006 365/225.7 |
| 2019/0044513 A1* | 2/2019 | Ng .................... | H03K 19/00315 |

* cited by examiner

*Primary Examiner* — Connie C Yoha
(74) *Attorney, Agent, or Firm* — Holland & Hart LLP (57) ABSTRACT

Methods, systems, and devices for memory device random option inversion are described. A memory device may use a second set of fuses to selectively invert options associated with a first set of fuses (e.g., blown fuses). The first set of fuses may output a first set of logic states. Option inversion logic circuitry may perform decoding based on a second set of logic states output by the second set of fuses to identify logic states of the second set of logic states that match the first set of logic states. Based on identifying the logic states, the option inversion logic circuitry may select either a logic state of the first set of logic states or an inverted logic state corresponding to the logic state, and store the selected logic state in a latch of the memory device.

20 Claims, 7 Drawing Sheets

MEMORY DEVICE RANDOM OPTION INVERSION

BACKGROUND

The following relates generally to one or more systems for memory and more specifically to memory device random option inversion.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A memory device may include a set of fuses (e.g., hundreds or thousands of fuses) used for configuring parameters (e.g., timing, voltage levels, among other examples) of the memory device. In some examples, the set of fuses may be used to implement options for a test mode (e.g., after production of the memory device). Additionally or alternatively, a user of the memory device may use the set of fuses to implement options based on a user configuration, such as for debugging, experimentations, functional adjustments (e.g., voltage, timing, or other trim adjustments), etc.

In some cases, a fuse (e.g., a fuse or an anti-fuse) may be programmed (e.g., blown), where the user may be unable to invert, undo, or alter an option associated with a blown fuse. The memory device may mitigate the effect of a blown fuse using an undo fuse or an exclusive-OR (XOR) fuse, which may include an additional one or more fuses coupled with an XOR logic gate. However, as the quantity of fuses in the set of fuses increases, it may become inefficient or costly to include undo fuses or XOR fuses in the memory device. For example, additional undo fuses or XOR fuses may result in a substantial increase in area on the memory device.

According to the techniques described herein, a memory device may use a second set of fuses (e.g., spare fuses, previously unused fuses, among other examples) to selectively invert options associated with a first set of fuses (e.g., blown fuses). The first set of fuses may output a first set of logic states. The memory device may include logic sequencing circuitry (e.g., for phase and strobe control), which may be used to sequence the first set of logic states over phases of lanes in the memory device. In some examples, the phases may be grouped in cycles. The memory device may further include option inversion logic circuitry configured to decode the phases, lanes, and cycles of the first set of logic states. The option inversion logic circuitry may perform the decoding based on a second set of logic states output by the second set of fuses to identify logic states of the second set of logic states that are to be used to invert the first set of logic states. Based on identifying the logic states, the option inversion logic circuitry may select either a logic state of the first set of logic states or an inverted logic state, and store the selected logic state in a latch of the memory device. By using the second set of fuses with the option inversion logic circuitry, the memory device may have greater flexibility to reconfigure parameters by inverting outputs of blown fuses without including additional fuses (e.g., undo fuses, XOR fuses, among other examples) for each of the first set of fuses.

Features of the disclosure are initially described in the context of systems and dies as described with reference to FIGS. 1 and 2. Features of the disclosure are described in the context of a block diagram, a logic diagram, and a flow diagram as described with reference to FIGS. 3-5. These and other features of the disclosure are further illustrated by and described with reference to an apparatus diagram and flowcharts that relate to memory device random option inversion as described with reference to FIGS. 6 and 7.

Figure 1:
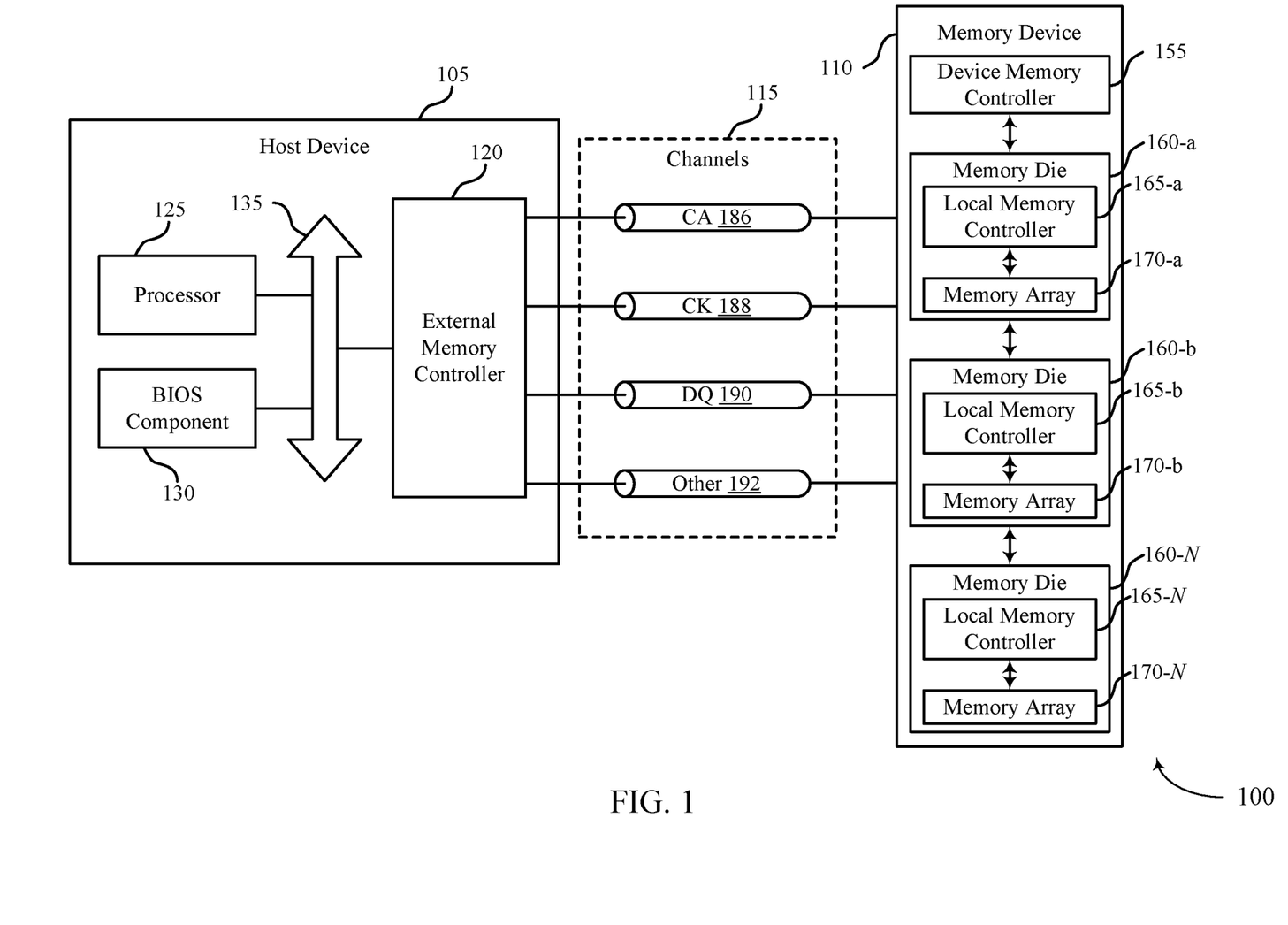
FIG. 1 illustrates an example of a system that supports memory device random option inversion in accordance with examples as disclosed herein.

FIG. 1 illustrates an example of a system 100 that supports memory device random option inversion in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

In some examples, the memory device 110 may use a second set of fuses (e.g., spare fuses, previously unused fuses, among other examples) to selectively invert options associated with the first set of fuses (e.g., blown fuses). The first set of fuses may output a first set of logic states. The memory device 110 may include logic sequencing circuitry (e.g., in the device memory controller 155 or the local memory controllers 165 or both), which may be used to sequence the first set of logic states over phases of lanes in the memory device 110. In some examples, the phases may be grouped in cycles. The local memory controllers 165 (or the device memory controller 155) may further include option inversion logic circuitry configured to decode the phases, lanes, and cycles of the first set of logic states. The option inversion logic circuitry may perform the decoding based on a second set of logic states output by the second set of fuses to identify logic states of the second set of logic states that correspond to the first set of logic states. Based on identifying the logic states, the option inversion logic circuitry may be configured to select either a logic state of the first set of logic states or an inverted logic state corresponding to the logic state, and store the selected logic state in a latch of the memory device 110. By using the second set of fuses with the option inversion logic circuitry, the memory device 110 may have greater flexibility to reconfigure parameters by inverting outputs of blown fuses without including additional fuses (e.g., undo fuses, XOR fuses, among other examples) for each of the first set of fuses.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
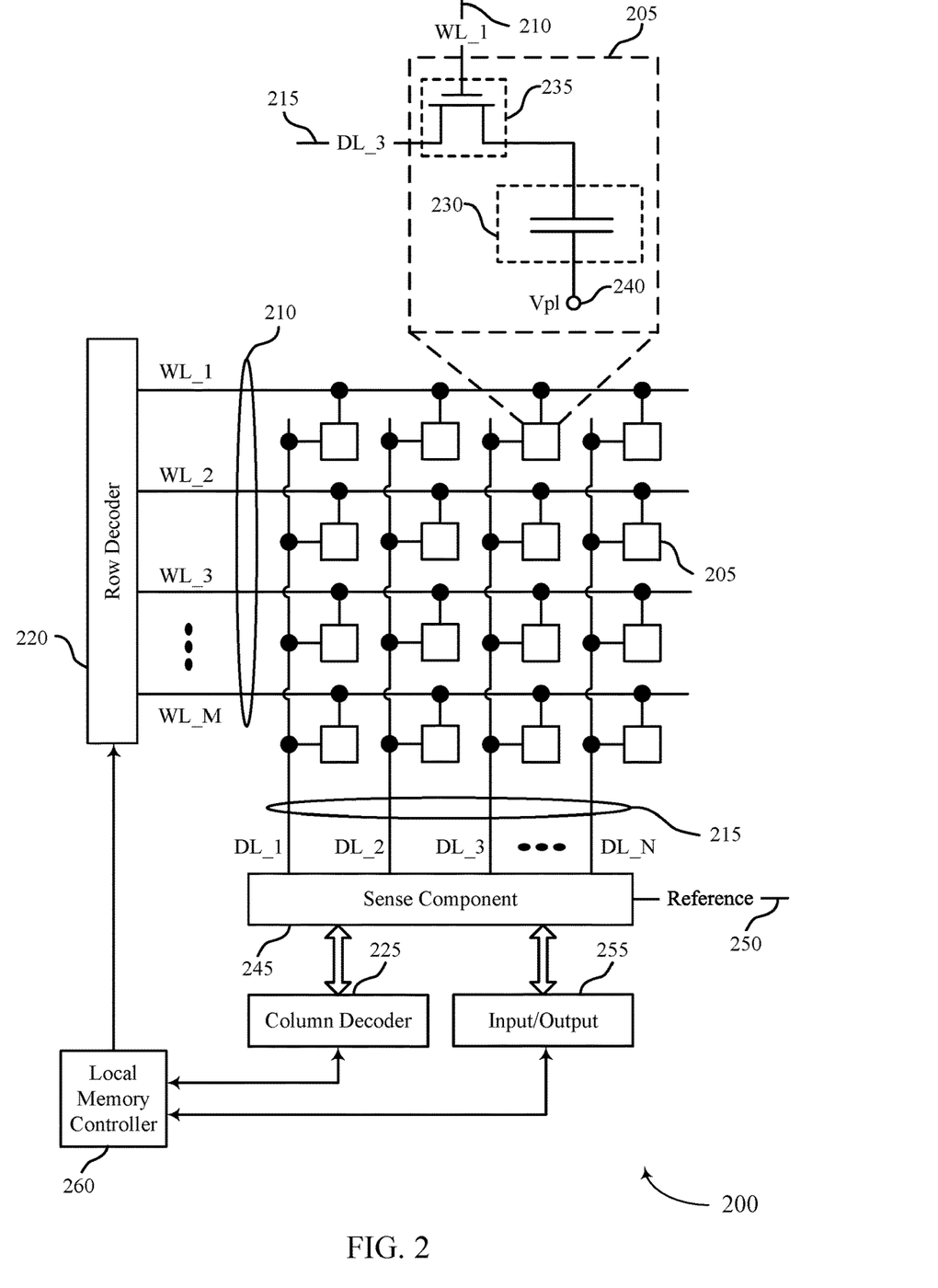
FIG. 2 illustrates an example of a memory die that supports memory device random option inversion in accordance with examples as disclosed herein.

FIG. 2 illustrates an example of a memory die 200 that supports memory device random option inversion in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vp1, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The memory die 200 may include a set of fuses (e.g., hundreds or thousands of fuses) used for configuring parameters (e.g., timing, voltage levels, among other examples) of the memory die 200. In some examples, the set of fuses may be used to implement options for a test mode (e.g., after production of the memory die 200). Additionally or alternatively, a user of the memory die 200 may use the set of fuses to implement options based on a user configuration, such as for debugging, experimentations, usage adjustments, etc.

In some cases, a fuse may be programmed (e.g., blown), where the user may be unable to invert, undo, or alter an option associated with a blown fuse. The memory die 200 may allow additional flexibility for a blown fuse using an undo fuse or an XOR fuse, which may include one or more additional fuses coupled with an XOR logic gate. However, as the quantity of fuses in the set of fuses increases, it may become inefficient or costly to include undo fuses or XOR fuses in the memory die 200. For example, additional undo fuses or XOR fuses for most or all of the fuses on the die may result in a substantial increase in area on the memory die 200.

According to the techniques described herein, the memory die 200 may use a second set of fuses (e.g., spare fuses, previously unused fuses, among other examples) to selectively invert options associated with the first set of fuses (e.g., blown fuses). The first set of fuses may output a first set of logic states. The memory die 200 may include logic sequencing circuitry (e.g., in the local memory controller 260), which may be used to sequence the first set of logic states over phases of lanes in the memory die 200. In some examples, the phases may be grouped in cycles. The local memory controller 260 may further include option inversion logic circuitry configured to decode the phases, lanes, and cycles of the first set of logic states. The option inversion logic circuitry may perform the decoding based on a second set of logic states output by the second set of fuses to identify logic states of the second set of logic states that correspond to the first set of logic states. Based on identifying the logic states, the option inversion logic circuitry may be configured to select either a logic state of the first set of logic states or an inverted logic state, and store the selected logic state in a latch of the memory die 200. By using the second set of fuses with the option inversion logic circuitry, the memory die 200 may have greater flexibility to reconfigure parameters by inverting outputs of blown fuses without including additional fuses (e.g., undo fuses, XOR fuses, among other examples) for most or all of the first set of fuses.

Figure 3:
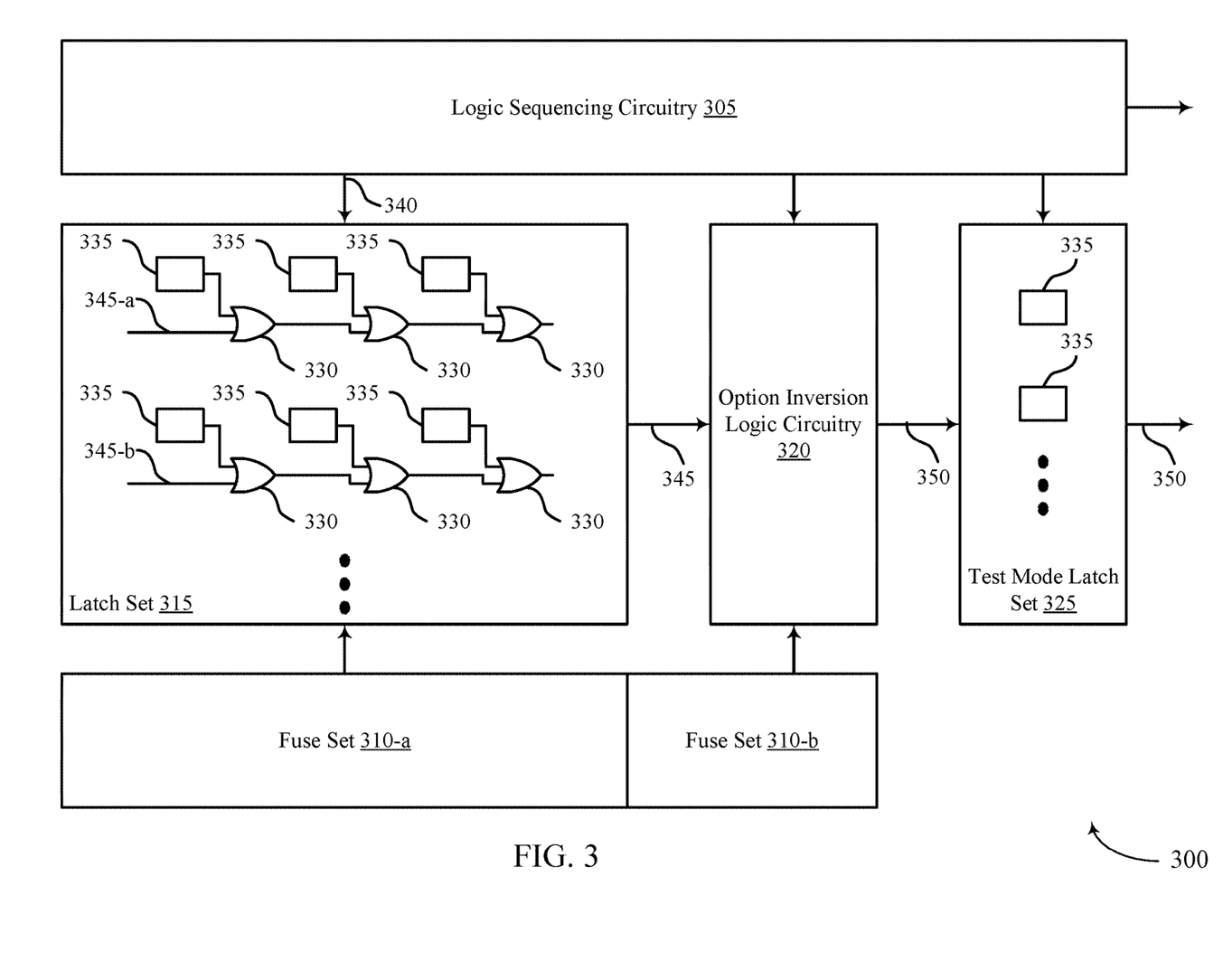
FIG. 3 illustrates an example of a block diagram that supports memory device random option inversion in accordance with examples as disclosed herein.

FIG. 3 illustrates an example of a block diagram 300 that supports memory device random option inversion in accordance with examples as disclosed herein. The block diagram 300 may illustrate components included in one or more aspects of a memory die or a memory device, or another type of electronic device, as described with reference to FIGS. 1 and 2. For example, one or more components illustrated in the block diagram 300 may be included in a device memory controller 155 or a local memory controller 165 or both of a memory device 110 described with reference to FIG. 1, or in a local memory controller 260 of a memory die 200 described with reference to FIG. 2.

The block diagram 300 may include logic sequencing circuitry 305 (e.g., for phase and strobe control) and fuse sets 310. A fuse set 310-a may include fuses (e.g., hundreds or thousands of fuses) used for configuring parameters (e.g., timing, voltage levels, among other examples) of a memory device. The fuses of the fuse set 310-a may output a first set of logic states, which may be read out into a latch set 315. The latch set 315 may include latches 335 arranged along lanes 345 (e.g., data lanes). In some examples, the latches 335 may be arranged along the lanes 345 in a daisy chain configuration using logic gates 330 (e.g., tri-state gates, AND gates, OR gates). The logic sequencing circuitry 305 may be configured to sequence the first set of logic states from the fuse set 310-*a* over phases of the lanes 345. In some examples, the phases may be grouped in cycles. The logic sequencing circuitry 305 may output signaling 340 to the latch set 315 indicating the sequencing of the first set of logic states over the phases and cycles of the lanes 345.

The lanes 345 may be output to option inversion logic circuitry 320, which may be configured to decode the lanes 345 and corresponding phases and cycles of the first set of logic states. The option inversion logic circuitry 320 may perform the decoding based on a second set of logic states output by a fuse set 310-*b* to identify logic states of the second set of logic states that correspond to the first set of logic states. In some examples, the fuse set 310-*b* may include spare fuses, previously unused fuses, etc. Based on identifying the logic states, the option inversion logic circuitry 320 may select either a logic state of the first set of logic states or an inverted logic state corresponding to the logic state. For example, a group of fuses (which may be referred to as an option) of the fuse set 310-*b* may be configured to invert one or more logic states corresponding to a lane 345, a phase, a cycle, etc. In some examples, the option inversion logic circuitry 320 may include one or more multiplexers for selecting between the logic states and the inverted logic states.

The option inversion logic circuitry 320 may output the selected logic states (e.g., logic states of the first set of logic states or corresponding inverted logic states) over lanes 350 (e.g., lanes with modified logic states) which may be broadcast to other circuits of the device, which may include latches to latch selected lanes on a given phase and cycle to obtain the logic state associated with a given fuse of the first fuse set 310-*a*. In some cases, the device may include test mode latch set 325, which may include latches 335 configured to store logic states for configuring parameters (e.g., overriding the fuses) of the memory device in a test mode. The test mode latch set 325 and the logic sequencing circuitry 305 may be configured to output selected logic states to other areas (e.g., local memory controllers, memory arrays, among other examples) to implement the selected options or parameters. By using the fuse set 310-*b* with the option inversion logic circuitry 320, the memory device may have greater flexibility to reconfigure parameters by inverting outputs of blown fuses without including additional fuses (e.g., undo fuses, XOR fuses, among other examples) for many or all of the first fuse set 310-*a*.

Figure 4:
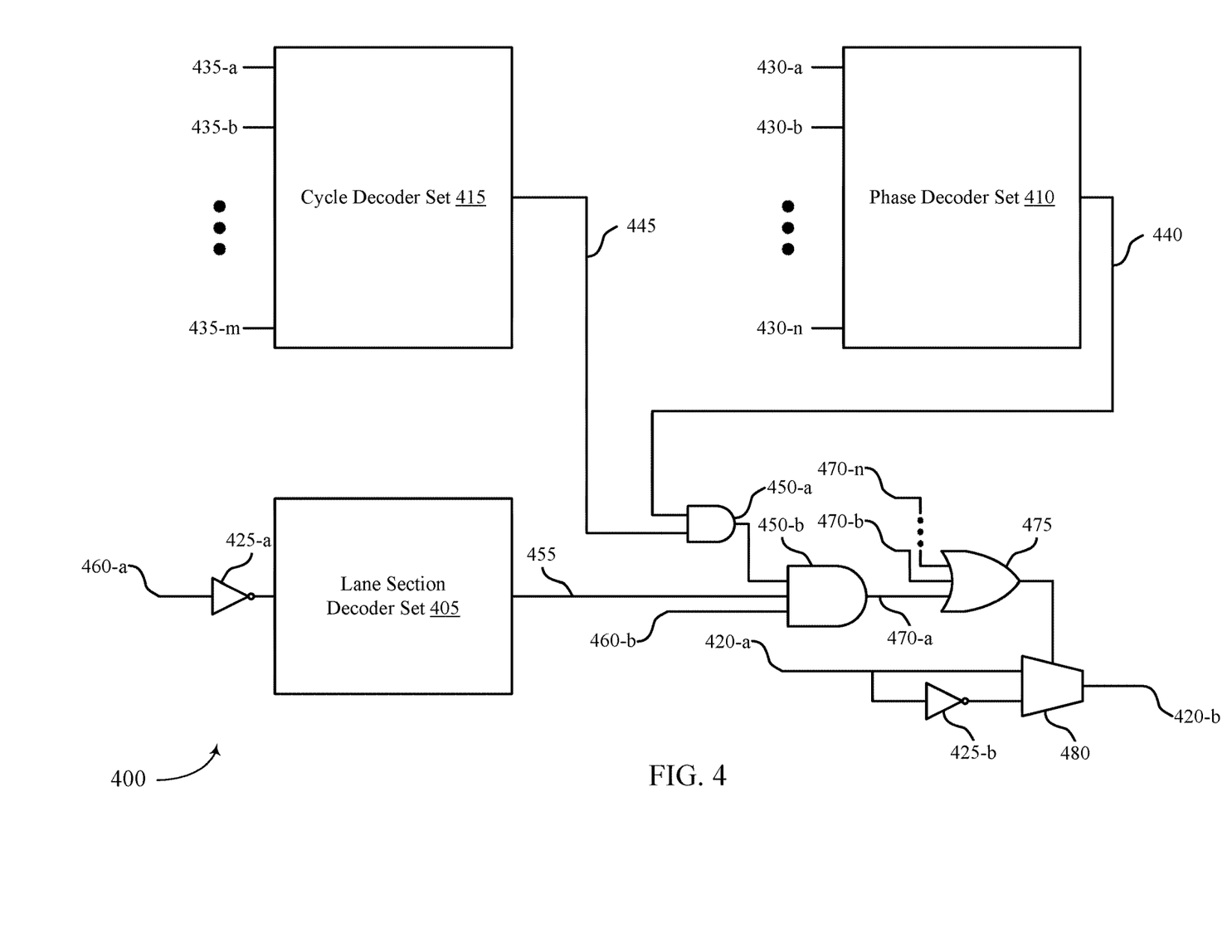
FIG. 4 illustrates an example of a logic diagram that supports memory device random option inversion in accordance with examples as disclosed herein.

FIG. 4 illustrates an example of a logic diagram 400 that supports memory device random option inversion in accordance with examples as disclosed herein. The logic diagram 400 may illustrate components included in one or more aspects of a memory die or a memory device, or another type of electronic device, as described with reference to FIGS. 1 and 2. For example, one or more components illustrated in the logic diagram 400 may be included in a device memory controller 155 or a local memory controller 165 or both of a memory device 110 described with reference to FIG. 1, or in a local memory controller 260 of a memory die 200 described with reference to FIG. 2.

The logic diagram 400 may illustrate circuits included in option inversion logic circuitry. The logic diagram 400 may include a lane section decoder set 405, a phase decoder set 410, and a cycle decoder set 415 configured to decode lanes, phases, and cycles associated with a first set of logic states output by a first set of fuses. Each decoder set may include one or more logic gates (e.g., AND gates, OR gates) for comparing logic states of the first set of logic states. The decoders may be configured to perform the decoding based on a second set of logic states output by a second set of fuses (e.g., spare fuses, previously unused fuses, among other examples) to identify logic states of the second set of logic states that match the first set of logic states. The logic states output by the second set of fuses may be decoded into individual signals that are asserted if the logic states correspond to the particular cycle, phase, or lane. The cycle, phase, or lane may then be represented by individual (e.g., "one-hot") signals which are compared to the decoded logic states. For example, if four cycles of sixteen phases are used to broadcast the logic states of the first set of fuses, there may be two phase bits and four cycle bits in each subset or "option" of the second set of fuses, which may be decoded and compared (e.g., using AND gates) to determine if the cycle and phase match. The lane may be similarly decoded and compared to individual lane signals.

The first set of logic states may be sequenced over a set of phases 430 of data lanes, which may be grouped in cycles 435. The second set of fuses may include a quantity of groups for performing the decoding at the decoder sets. For example, the phase decoder set 410 may use a first group of fuses of an option of the second set of fuses to identify a phase match 440 from the phases 430 based on sequencing the first set of logic states. Similarly, the lane section decoder set 405 may use a second group of fuses of the option of the second set of fuses to identify a lane section match 455, the cycle decoder set 415 may use a third group of fuses of the option of the second set of fuses to identify a cycle match 445 from the cycles 435. The phase match 440, the cycle match 445, and the lane section match 455 may act as inputs, along with a bit select fuse 460-*b*, for AND gates 450-*a* and 450-*b* to output an inversion option 470-*a*, which may selectively invert a logic state of a lane 420-*a*. In some examples, the option inversion logic circuitry may include additional decoders (not shown) to output inversion options 470-*b* through 470-*n*, where each inversion option 470 may be used to selectively invert a logic state of a lane 420-*a*. For example, the second set of fuses may be grouped into multiple inversion options, and each inversion option may be associated with option inversion logic circuitry to match a particular cycle, phase, and lane, and may include one or more bit select fuses 460 to selectively invert the particular lane for the matching cycle and phase.

For each lane, the inversion options 470 may act as inputs for an OR gate 475, and the output of the OR gate may configure an output of a multiplexer 480. The logic state of the lane 420-*a* may be a first input of the multiplexer 480. The logic state may be inverted via an inverter 425-*b*, and the inverted logic state may be a second input of the multiplexer 480. The multiplexer 480 may be configured to select between the logic state and the inverted logic state based on the output of the OR gate 475. The multiplexer 480 may output the selected logic state to a lane 420-*b*, which may be coupled with a latch to store the selected logic state. Other circuits for combining inversion options 470 and inverting the logic states for each lane may be used, for example the multiplexer 480 and inverter 425-*b* may be replaced with other types of logic gates (e.g., AND gates, OR gates, XOR gates) for performing the inversion based on the inversion options 470 and corresponding bit select fuses.

In some examples, each set of fuses of the inversion options may include additional fuses of the second set of fuses in place of one or more logic gates. That is, group of fuses of the inversion options may increase a fuse count to reduce a logic gate count, or vice versa, based on a use case of the memory device. For example, the group of fuses may have a bitmap for one or all bits of the cycle, phase, or lane in place of an index value corresponding to a cycle, phase, or lane. Thus, the logic uses for determining inversion options 470 may be simplified (e.g., may only include matching for each bit of the bitmap instead of decoding the index to each bit). In some examples, the lane section decoder set 405 may be selectively coupled via an inverter 425-a with a disable fuse 460-a, which may be referred to as an option out. The disable fuse 460-a may enable a memory device to disable the decoding process and output the first set of logic states to the data lane 420-b without inversion.

Figure 5:
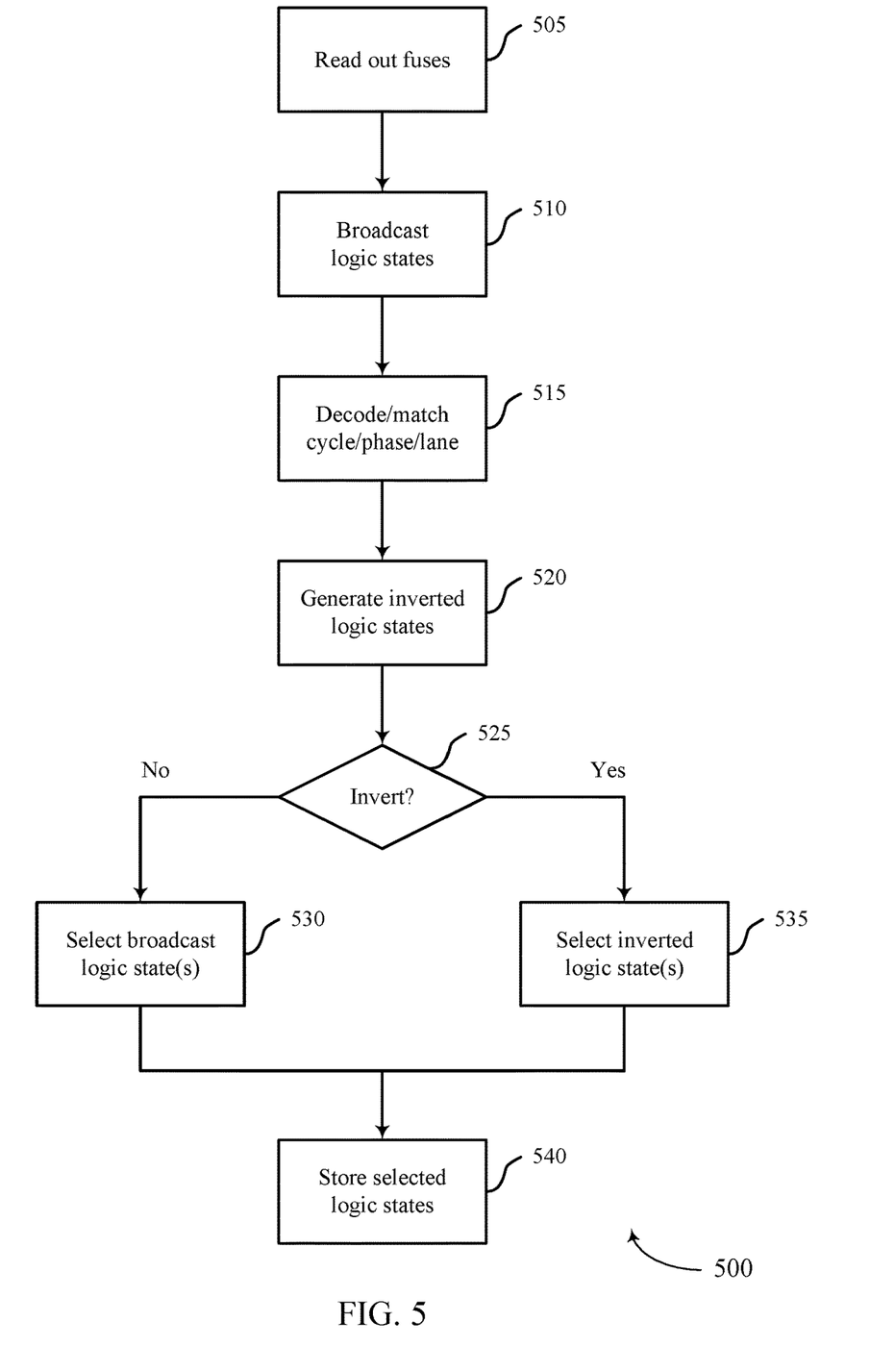
FIG. 5 illustrates an example of a flow diagram that supports memory device random option inversion in accordance with examples as disclosed herein.

FIG. 5 illustrates an example of a flow diagram 500 that supports memory device random option inversion in accordance with examples as disclosed herein. The flow diagram 500 may illustrate operations performed by components included in one or more aspects of a memory die or a memory device, or another type of electronic device, as described with reference to FIGS. 1 and 2. For example, one or more operations illustrated in the flow diagram 500 may be performed at a device memory controller 155 or a local memory controller 165 or both of a memory device 110 described with reference to FIG. 1, or at a local memory controller 260 of a memory die 200 described with reference to FIG. 2. In some examples, the operations illustrated in the flow diagram 500 may be performed at one or more components of the block diagram 300 described with reference to FIG. 3.

At 505, a first set of logic states may be read out from a first set of fuses, and a second set of logic states may be read out from a second set of fuses. The first set of fuses may be used for configuring parameters (e.g., timing, voltage levels, among other examples) of a memory device. At 510, the first set of logic states may be output to a set of latches. The latches may be arranged along lanes (e.g., data lanes). In some examples, the latches may be arranged along the lanes in a daisy chain configuration using logic gates (e.g., tri-state gates, AND gates, OR gates). The first set of logic states may be sequenced over a set of phases of the lanes for a broadcast operation of the first set of logic states. In some examples, the phases may be grouped in a set of cycles, and the first set of logic states may be sequenced over the set of cycles.

At 515, the phases, lanes, and cycles of the first set of logic states may be decoded, for example using option inversion logic circuitry. The phases, lanes, and cycles may be decoded for comparison with a second set of logic states output by a second set of fuses (e.g., spare fuses, previously unused fuses, among other examples) to identify inversion options of the second set of logic states that match the first set of logic states. In some examples, each inversion option of the second set of fuses may include a quantity of groups for decoding to match the cycle, phase, and lane. For example, a first group of fuses of an inversion option may be used to identify a matching phase from the phases based on sequencing the first set of logic states. Similarly, a second group of fuses of the inversion option may be used to identify a matching lane section, and a third group of fuses of the inversion option may be used to identify a matching cycle from the cycles. In some examples, each inversion option may be associated with a separate decoding to match the sequenced phases, cycles, or lanes.

At 520, a set of inverted logic states may be generated corresponding to the first set of logic states, for example using option inversion logic circuitry (e.g. lane inversion logic). At 525, the option inversion logic circuitry may determine whether to output inverted logic states or logic states of the first set of logic states. For example, a fuse of the first set of fuses may be blown, and an inverted logic state corresponding to the blown fuse may enable a user to invert, undo, or alter an option of a memory device. If the option inversion logic circuitry determines not to invert a logic state, at 530 the logic state of the first set of logic states may be selected, for example using a multiplexer. If the option inversion logic circuitry determines to invert a logic state, at 535 an inverted logic state corresponding to the logic state may be selected, for example using a multiplexer.

At 540, the selected logic states (e.g., logic states or corresponding inverted logic states) may be broadcast and stored in a set of latches. For example the selected logic states may be broadcast to latches in other areas of the memory device (e.g., local memory controllers, memory arrays, among other examples) to implement the selected options or parameters. Each of the latches may have an input from a lane, and latch a logic state based on a decoded cycle and phase. By using the second set of fuses with the option inversion logic circuitry, the memory device may have greater flexibility to reconfigure parameters by inverting outputs of blown fuses without including additional fuses (e.g., undo fuses, XOR fuses, among other examples).

Figure 6:
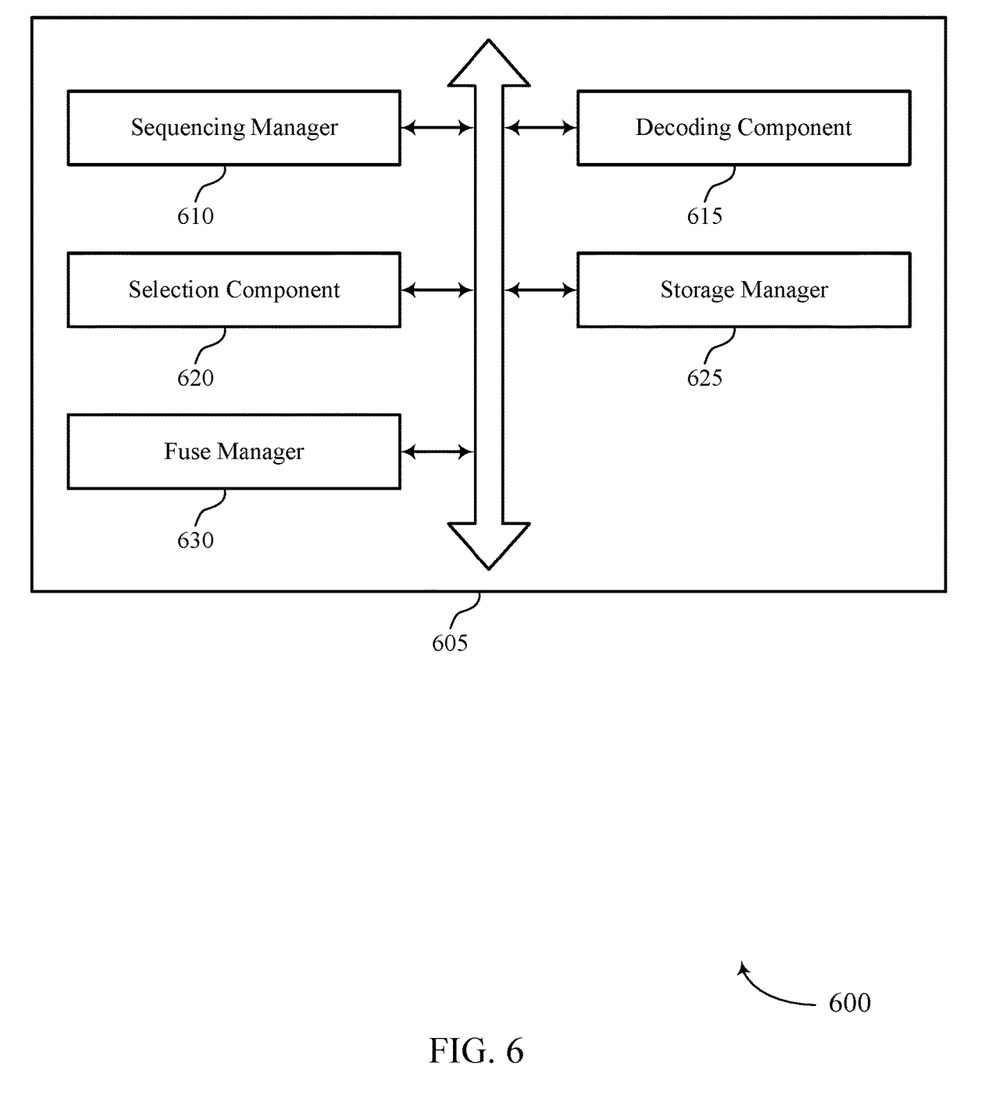
FIG. 6 shows a block diagram of a memory device that supports memory device random option inversion in accordance with examples as disclosed herein.

FIG. 6 shows a block diagram 600 of a memory device 605 that supports memory device random option inversion in accordance with examples as disclosed herein. The memory device 605 may be an example of aspects of a memory device as described with reference to FIGS. 1 and 2. The memory device 605 may include a sequencing manager 610, a decoding component 615, a selection component 620, a storage manager 625, and a fuse manager 630. Each of these modules may communicate, directly or indirectly, with one another (e.g., via one or more buses).

The fuse manager 630 may determine a first set of logic states output by a first set of fuses, the first set of logic states associated with configuration of a memory device.

The sequencing manager 610 may sequence the first set of logic states over a set of phases of a set of lanes. In some examples, the sequencing manager 610 may sequence the first set of logic states over the set of cycles of the set of lanes.

The fuse manager 630 may determine a second set of logic states output by a second set of fuses. In some cases, the second set of fuses includes a set of groups of fuses, each group of fuses including a first subset of fuses associated with a phase of the set of phases and a second subset of fuses associated with a lane of the one or more lanes.

The decoding component 615 may decode one or more phases and one or more lanes based on the second set of logic states. In some examples, the decoding component 615 may decode one or more cycles based on the second set of logic states. In some examples, the decoding component 615 may compare the sequenced set of phases to the phase of each group of fuses of the second set of fuses.

The selection component 620 may select between a respective logic state and a respective inverted logic state for the set of phases of the one or more lanes based on the one or more lanes and the one or more phases. In some examples, the selection component 620 may generate, using lane inversion logic, the respective inverted logic states for the one or more phases of the one or more lanes. In some examples, the selection component 620 may output, using one or more multiplexers, the respective logic states or the generated respective inverted logic states to one or more latches based on the selecting, where storing the respective logic states or the respective inverted logic states is further based on the outputting.

The storage manager 625 may store the respective logic states or the respective inverted logic states based on the selecting.

Figure 7:
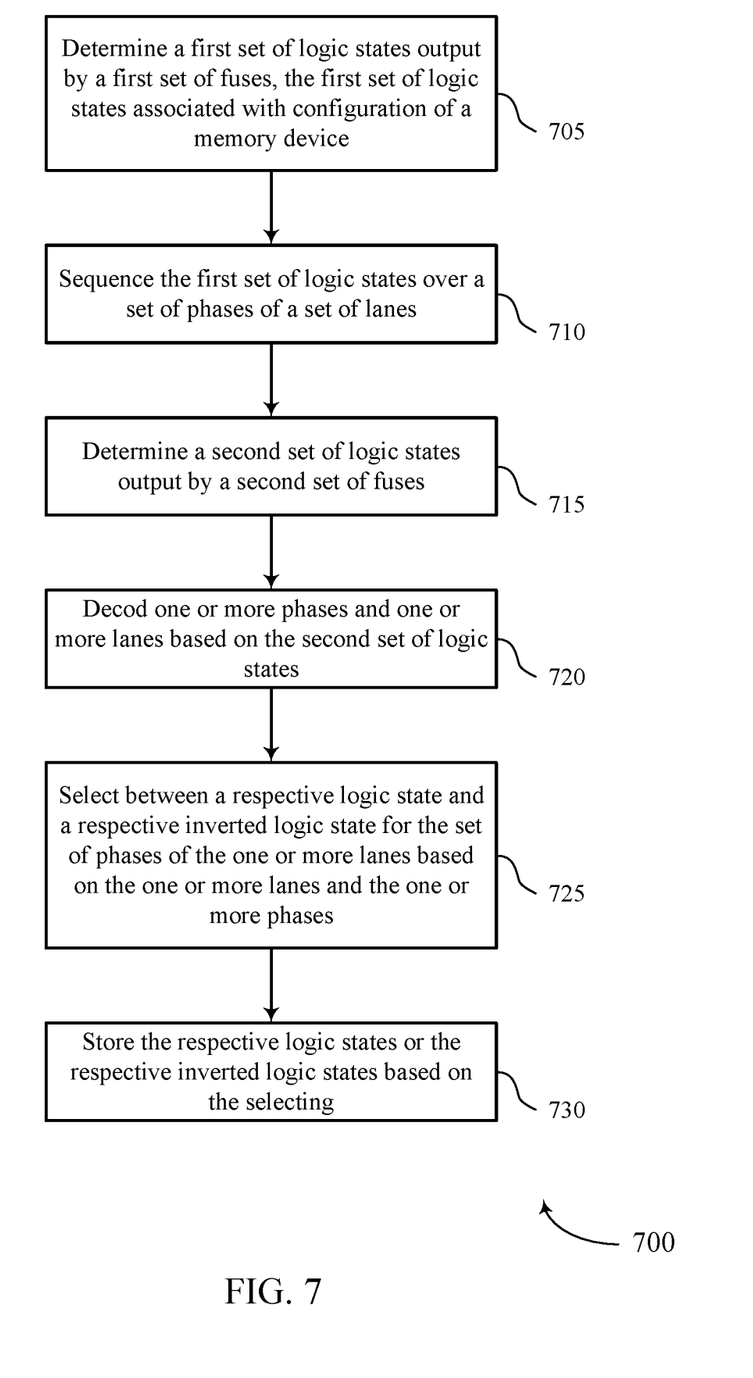
FIG. 7 shows a flowchart illustrating a method or methods that support memory device random option inversion in accordance with examples as disclosed herein.

FIG. 7 shows a flowchart illustrating a method or methods 700 that supports memory device random option inversion in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may determine a first set of logic states output by a first set of fuses, the first set of logic states associated with configuration of a memory device. The operations of 705 may be performed according to the methods described herein. In some examples, aspects of the operations of 705 may be performed by a first fuse manager as described with reference to FIG. 6.

At 710, the memory device may sequence the first set of logic states over a set of phases of a set of lanes. The operations of 710 may be performed according to the methods described herein. In some examples, aspects of the operations of 710 may be performed by a sequencing manager as described with reference to FIG. 6.

At 715, the memory device may determine a second set of logic states output by a second set of fuses. The operations of 715 may be performed according to the methods described herein. In some examples, aspects of the operations of 715 may be performed by a second fuse manager as described with reference to FIG. 6.

At 720, the memory device may decode one or more phases and one or more lanes based on the second set of logic states. The operations of 720 may be performed according to the methods described herein. In some examples, aspects of the operations of 720 may be performed by a decoding component as described with reference to FIG. 6.

At 725, the memory device may select between a respective logic state and a respective inverted logic state for the set of phases of the one or more lanes based on the one or more lanes and the one or more phases. The operations of 725 may be performed according to the methods described herein. In some examples, aspects of the operations of 725 may be performed by a selection component as described with reference to FIG. 6.

At 730, the memory device may store the respective logic states or the respective inverted logic states based on the selecting. The operations of 730 may be performed according to the methods described herein. In some examples, aspects of the operations of 730 may be performed by a storage manager as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for determining a first set of logic states output by a first set of fuses, the first set of logic states associated with configuration of a memory device, sequencing the first set of logic states over a set of phases of a set of lanes, determining a second set of logic states output by a second set of fuses, decoding one or more phases and one or more lanes based on the second set of logic states, selecting between a respective logic state and a respective inverted logic state for the set of phases of the one or more lanes based on the one or more lanes and the one or more phases, and storing the respective logic states or the respective inverted logic states based on the selecting.

In some examples of the method 700 and the apparatus described herein, the second set of fuses includes a set of groups of fuses, each group of fuses including a first subset of fuses associated with a phase of the set of phases and a second subset of fuses associated with a lane of the one or more lanes.

Some examples of the method 700 and the apparatus described herein may further include operations, features, means, or instructions for sequencing the first set of logic states over the set of cycles of the set of lanes, and decoding one or more cycles based on the second set of logic states.

In some examples of the method 700 and the apparatus described herein, the decoding further may include operations, features, means, or instructions for comparing the sequenced set of phases to the phase of each group of fuses of the second set of fuses.

Some examples of the method 700 and the apparatus described herein may further include operations, features, means, or instructions for generating, using lane inversion logic, the respective inverted logic states for the one or more phases of the one or more lanes.

Some examples of the method 700 and the apparatus described herein may further include operations, features, means, or instructions for outputting, using one or more multiplexers, the respective logic states or the generated respective inverted logic states to one or more latches based on the selecting, where storing the respective logic states or the respective inverted logic states may be further based on the outputting.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a first set of fuses configured to output a first set of logic states associated with configuration of a memory device, first circuitry coupled with the first set of fuses and configured to sequence the first set of logic states over a set of phases of a set of lanes, a second set of fuses configured to output a second set of logic states, second circuitry configured to decode one or more phases and one or more lanes based on the second set of logic states, third circuitry configured to select between a respective logic state and a respective inverted logic state for the one or more phases of the one or more lanes based on the one or more lanes and the one or more phases, and a set of latches configured to store the respective logic states or the respective inverted logic states based on the selection.

In some examples, the second set of fuses includes a set of groups of fuses, each group of fuses including a first subset of fuses associated with a phase of the set of phases and a second subset of fuses associated with a lane of the one or more lanes.

In some examples, the set of phases may be grouped in a set of cycles of the set of lanes, each group of fuses of the second set of fuses further includes a third subset of fuses associated with a cycle of the set of cycles, the first circuitry may be further configured to sequence the first set of logic states over the set of cycles of the set of lanes, and the second circuitry may be further configured to decode one or more cycles based on the second set of logic states.

In some examples, the second circuitry includes a set of second circuitry blocks associated with each group of the set of groups of fuses of the second set of fuses, each of the set of second circuitry blocks being configured to compare the sequenced set of phases to the phase of each group of fuses.

In some examples, the second subset of fuses of each group of fuses of the second set of fuses includes an encoded value for the lane of the one or more lanes.

In some examples, the second subset of fuses of each group of fuses of the second set of fuses includes a bitmap including a set of fuses corresponding to the set of lanes.

In some examples, the third circuitry includes lane inversion logic coupled with the one or more lanes, the lane inversion logic configured to generate the respective inverted logic states for the one or more phases of the one or more lanes.

In some examples, the lane inversion logic includes one or more multiplexers coupled with the set of latches, the one or more multiplexers configured to output the respective logic states or the generated respective inverted logic states based on the selection.

An apparatus is described. The apparatus may include a first set of fuses, a second set of fuses, and a controller coupled with the first set of fuses and the second set of fuses, where the controller is operable to determine a first set of logic states output by the first set of fuses, the first set of logic states associated with configuration of a memory device, sequence the first set of logic states over a set of phases of a set of lanes, determine a second set of logic states output by the second set of fuses, decode one or more phases and one or more lanes based on the second set of logic states, select between a respective logic state and a respective inverted logic state for the set of phases of the one or more lanes based on the one or more lanes and the one or more phases, and store the respective logic states or the respective inverted logic states based on the selecting.

In some examples, the second set of fuses includes a set of groups of fuses, each group of fuses including a first subset of fuses associated with a phase of the set of phases and a second subset of fuses associated with a lane of the one or more lanes.

In some examples, the set of phases may be grouped in a set of cycles of the set of lanes, and the controller may be further operable to sequence the first set of logic states over the set of cycles of the set of lanes, and decode one or more cycles based on the second set of logic states.

In some examples, the controller may be further operable to compare the sequenced set of phases to the phase of each group of fuses of the second set of fuses.

In some examples, the controller may be further operable to generate the respective inverted logic states for the one or more phases of the one or more lanes.

In some examples, the controller may be further operable to output the respective logic states or the generated respective inverted logic states to one or more latches based on the selecting, where storing the respective logic states or the respective inverted logic states may be further based on the outputting.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a first set of fuses configured to output a first set of logic states associated with configuration of a memory device;
    first circuitry coupled with the first set of fuses and configured to sequence the first set of logic states over a plurality of phases of a set of lanes;
    a second set of fuses configured to output a second set of logic states;
    second circuitry configured to decode one or more phases and one or more lanes based at least in part on the second set of logic states;
    third circuitry configured to select between a respective logic state and a respective inverted logic state for the one or more phases of the one or more lanes based at least in part on the one or more lanes and the one or more phases; and
    a set of latches configured to store the respective logic states or the respective inverted logic states based at least in part on the selection.

2. The apparatus of claim 1, wherein the second set of fuses comprises a plurality of groups of fuses, each group of fuses comprising a first subset of fuses associated with a phase of the plurality of phases and a second subset of fuses associated with a lane of the one or more lanes.

3. The apparatus of claim 2, wherein:
    the plurality of phases are grouped in a plurality of cycles of the set of lanes;
    each group of fuses of the second set of fuses further comprises a third subset of fuses associated with a cycle of the plurality of cycles;
    the first circuitry is further configured to sequence the first set of logic states over the plurality of cycles of the set of lanes; and
    the second circuitry is further configured to decode one or more cycles based at least in part on the second set of logic states.

4. The apparatus of claim 2, wherein the second circuitry comprises a plurality of second circuitry blocks associated with each group of the plurality of groups of fuses of the second set of fuses, each of the plurality of second circuitry blocks being configured to compare the sequenced plurality of phases to the phase of each group of fuses.

5. The apparatus of claim 2, wherein the second subset of fuses of each group of fuses of the second set of fuses comprises an encoded value for the lane of the one or more lanes.

6. The apparatus of claim 2, wherein the second subset of fuses of each group of fuses of the second set of fuses comprises a bitmap comprising a plurality of fuses corresponding to the set of lanes.

7. The apparatus of claim 1, wherein the third circuitry comprises lane inversion logic coupled with the one or more lanes, the lane inversion logic configured to generate the respective inverted logic states for the one or more phases of the one or more lanes.

8. The apparatus of claim 7, wherein the lane inversion logic comprises one or more multiplexers coupled with the set of latches, the one or more multiplexers configured to output the respective logic states or the generated respective inverted logic states based at least in part on the selection.

9. A method, comprising:
determining a first set of logic states output by a first set of fuses, the first set of logic states associated with configuration of a memory device;
sequencing the first set of logic states over a plurality of phases of a set of lanes;
determining a second set of logic states output by a second set of fuses;
decoding one or more phases and one or more lanes based at least in part on the second set of logic states;
selecting between a respective logic state and a respective inverted logic state for the plurality of phases of the one or more lanes based at least in part on the one or more lanes and the one or more phases; and
storing the respective logic states or the respective inverted logic states based at least in part on the selecting.

10. The method of claim 9, wherein the second set of fuses comprises a plurality of groups of fuses, each group of fuses comprising a first subset of fuses associated with a phase of the plurality of phases and a second subset of fuses associated with a lane of the one or more lanes.

11. The method of claim 10, wherein the plurality of phases are grouped in a plurality of cycles of the set of lanes, the method further comprising:
sequencing the first set of logic states over the plurality of cycles of the set of lanes; and
decoding one or more cycles based at least in part on the second set of logic states.

12. The method of claim 10, wherein the decoding further comprises:
comparing the sequenced plurality of phases to the phase of each group of fuses of the second set of fuses.

13. The method of claim 9, further comprising:
generating, using lane inversion logic, the respective inverted logic states for the one or more phases of the one or more lanes.

14. The method of claim 13, further comprising:
outputting, using one or more multiplexers, the respective logic states or the generated respective inverted logic states to one or more latches based at least in part on the selecting, wherein storing the respective logic states or the respective inverted logic states is further based at least in part on the outputting.

15. An apparatus, comprising:
a first set of fuses,
a second set of fuses, and
a controller coupled with the first set of fuses and the second set of fuses, wherein the controller is operable to:
determine a first set of logic states output by the first set of fuses, the first set of logic states associated with configuration of a memory device;
sequence the first set of logic states over a plurality of phases of a set of lanes;
determine a second set of logic states output by the second set of fuses;
decode one or more phases and one or more lanes based at least in part on the second set of logic states;
select between a respective logic state and a respective inverted logic state for the plurality of phases of the one or more lanes based at least in part on the one or more lanes and the one or more phases; and
store the respective logic states or the respective inverted logic states based at least in part on the selecting.

16. The apparatus of claim 15, wherein the second set of fuses comprises a plurality of groups of fuses, each group of fuses comprising a first subset of fuses associated with a phase of the plurality of phases and a second subset of fuses associated with a lane of the one or more lanes.

17. The apparatus of claim 16, wherein:
the plurality of phases are grouped in a plurality of cycles of the set of lanes; and
the controller is further operable to:
sequence the first set of logic states over the plurality of cycles of the set of lanes; and
decode one or more cycles based at least in part on the second set of logic states.

18. The apparatus of claim 16, wherein the controller is further operable to:
compare the sequenced plurality of phases to the phase of each group of fuses of the second set of fuses.

19. The apparatus of claim 15, wherein the controller is further operable to:
generate the respective inverted logic states for the one or more phases of the one or more lanes.

20. The apparatus of claim 19, wherein the controller is further operable to:
output the respective logic states or the generated respective inverted logic states to one or more latches based at least in part on the selecting, wherein storing the respective logic states or the respective inverted logic states is further based at least in part on the outputting.

* * * * *